United States Patent
Tanaka

(10) Patent No.: US 6,172,581 B1
(45) Date of Patent: Jan. 9, 2001

(54) SURFACE ACOUSTIC WAVE FILTERS WITH CASCADED TRANSVERSELY COUPLED MODE RESONATOR FILTERS

(75) Inventor: Naoki Tanaka, Sakai (JP)

(73) Assignee: Sanyo Electric Co., Ltd., Moriguchi (JP)

( * ) Notice: Under 35 U.S.C. 154(b), the term of this patent shall be extended for 0 days.

(21) Appl. No.: 09/309,764

(22) Filed: May 11, 1999

(30) Foreign Application Priority Data

May 13, 1998 (JP) .................................................. 10-130293
Mar. 23, 1999 (JP) .................................................. 11-078374

(51) Int. Cl.[7] ..................................................... H03H 9/64
(52) U.S. Cl. ...................... 333/194; 333/195; 310/313 D
(58) Field of Search .................................... 333/193–196; 310/313 R, 313 B, 313 C, 313 D

(56) References Cited

U.S. PATENT DOCUMENTS

| Re. 33,957 | * | 6/1992 | Nakazawa et al. | ................... 333/195 |
| 5,365,138 | * | 11/1994 | Saw et al. | ........................ 310/313 D |
| 5,604,393 | * | 2/1997 | Suzuki et al. | ..................... 333/193 X |

FOREIGN PATENT DOCUMENTS

| 61-144910 | * | 7/1986 | (JP) | ..................................... 333/195 |
| 62-199111 | * | 9/1987 | (JP) | ..................................... 333/195 |
| 63-87007 | | 4/1988 | (JP) | ..................................... 333/195 |
| 2-295306 | * | 12/1990 | (JP) | ..................................... 333/195 |
| 3-247109 | * | 11/1991 | (JP) . | |
| 4-207616 | | 7/1992 | (JP) | ..................................... 333/195 |
| 4-265009 | * | 9/1992 | (JP) | ..................................... 333/195 |
| 6-224688 | | 8/1994 | (JP) . | |
| 7-7370 | | 1/1995 | (JP) . | |
| 8-125490 | | 5/1996 | (JP) . | |
| 8-125489 | * | 5/1996 | (JP) . | |
| 10-276063 | * | 10/1998 | (JP) . | |

* cited by examiner

Primary Examiner—Benny Lee
Assistant Examiner—Barbara Summons
(74) Attorney, Agent, or Firm—Armstrong, Westerman, Hattori, McLeland & Naughton

(57) ABSTRACT

A surface acoustic wave filter of the transversely coupled mode resonator type including an interdigital electrode 1 having a plurality of electrode digits, and two reflectors 2, 3 arranged, respectively, at opposite sides of the interdigital electrode 1 at a distance C from the electrode and each having a plurality of electrode digits. The filter has a pitch ratio of A/B, where A is the digit pitch of the interdigital electrode 1, and B is the digit pitch of each of the reflectors 2, 3. The pitch ratio A/B and the distance C are determined such that on a two-dimensional coordinate system (X, Y) where the pitch ratio A/B is plotted as the Y-axis and a value C/$\lambda$ obtained by dividing the distance C by the wavelength $\lambda$ of surface acoustic waves is plotted as the X-axis, the pitch ratio A/B and the distance C are contained in a quadrilateral region having vertices at four points, i.e., point a (0.55, 0.983), point b (0.70, 1.010), point c (0.85, 1.010) and point d (0.85, 1.007), whereby the filter can be made more compact and is improved in characteristics outside the pass band.

3 Claims, 12 Drawing Sheets

FIG. 2

| PITCH RATIO [A/B] | DISTANCE c/λ | | | | | | | | | | | | | | |
|---|---|---|---|---|---|---|---|---|---|---|---|---|---|---|---|
| | 0.525 | 0.550 | 0.575 | 0.600 | 0.625 | 0.650 | 0.675 | 0.700 | 0.725 | 0.750 | 0.775 | 0.800 | 0.825 | 0.850 | 0.875 |
| 0.9825 | × | × | × | × | × | × | × | × | × | × | × | × | × | × | × |
| 0.9850 | × | × | O | × | × | × | × | × | × | × | × | × | × | × | × |
| 0.9875 | × | × | O | × | × | × | × | × | × | × | × | × | × | × | × |
| 0.9900 | × | × | × | O1 | O2 | ×3 | ×4 | ×5 | ×6 | ×7 | × | × | × | × | × |
| 0.9925 | × | × | × | O8 | O9 | ×10 | ×11 | ×12 | ×13 | ×14 | × | × | × | × | × |
| 0.9950 | × | × | × | ×15 | O16 | O17 | O18 | O19 | ×20 | ×21 | × | × | × | × | × |
| 0.9975 | × | × | × | × | × | O | O | O | O | × | × | × | × | × | × |
| 1.0000 | × | × | × | × | × | O | O | O | O | O | × | × | × | × | × |
| 1.0025 | × | × | × | × | × | × | O | O | O | O | O | × | × | × | × |
| 1.0050 | × | × | × | × | × | × | × | O | O | O | O | O | × | × | × |
| 1.0075 | × | × | × | × | × | × | × | O | O | O | O | O | O | O | × |
| 1.0100 | × | × | × | × | × | × | × | × | O | O | O | O | O | O | × |
| 1.0125 | × | × | × | × | × | × | × | × | × | × | × | × | × | × | × |

FIG. 3

| No. | PITCH RATIO A/B | DISTANCE C/λ | INSERTION LOSS (dB) | SPURIOUS RESONANCE LEVEL (dB) | EVALUATION |
|---|---|---|---|---|---|
| 1 | 0.990 | 0.600 | -4.5 | -60 | ○ |
| 2 | 0.990 | 0.625 | -4.3 | -55 | ○ |
| 3 | 0.990 | 0.650 | -3.5 | -46 | × |
| 4 | 0.990 | 0.675 | -3.2 | -44 | × |
| 5 | 0.990 | 0.700 | -3.0 | -41 | × |
| 6 | 0.990 | 0.725 | -2.8 | -38 | × |
| 7 | 0.990 | 0.750 | -2.7 | -38 | × |
| 8 | 0.995 | 0.600 | -5.5 | -60 | × |
| 9 | 0.995 | 0.625 | -4.9 | -60 | ○ |
| 10 | 0.995 | 0.650 | -4.2 | -60 | ○ |
| 11 | 0.995 | 0.675 | -3.6 | -56 | ○ |
| 12 | 0.995 | 0.700 | -3.1 | -50 | ○ |
| 13 | 0.995 | 0.725 | -2.7 | -45 | × |
| 14 | 0.995 | 0.750 | -2.5 | -41 | × |
| 15 | 1.000 | 0.600 | -6.0 | -60 | × |
| 16 | 1.000 | 0.625 | -5.5 | -60 | × |
| 17 | 1.000 | 0.650 | -4.9 | -60 | ○ |
| 18 | 1.000 | 0.675 | -4.2 | -60 | ○ |
| 19 | 1.000 | 0.700 | -3.9 | -60 | ○ |
| 20 | 1.000 | 0.725 | -3.6 | -58 | ○ |
| 21 | 1.000 | 0.750 | -3.3 | -53 | ○ |

SURFACE ACOUSTIC WAVE FILTERS WITH CASCADED TRANSVERSELY COUPLED MODE RESONATOR FILTERS

BACKGROUND OF THE INVENTION

1. Field of the Invention

The present invention relates to surface acoustic wave filters having improved characteristics outside the pass band.

2. Description of the Related Art

Surface acoustic wave filters for use in a narrow band and diminished in insertion loss are already known which comprise two filters of the transversely coupled mode resonator type connected in cascade and each comprising an interdigital electrode (interdigital transducer) and two reflectors arranged respectively at opposite sides of the electrode. Such surface acoustic wave filters are used chiefly as IF (intermediate-frequency wave) filters in communications devices.

Sufficient attenuation outside the pass band is required of IF filters, while when the filter is composed of filters of the transversely coupled mode resonator type connected in cascade and identical in characteristics, the filter in the first stage and the filter in the second stage are also approximately identical in characteristics outside the pass band, therefore permitting occurrence of spurious resonance at approximately the same frequency and consequently giving rise to the problem that spurious resonance occurs at a high level outside the pass band.

To solve this problem, two cascaded component filters are made different in the pitch of reflectors and/or the number of pairs thereof while being made identical in characteristics in the pass band, and are thereby made different in characteristics outside the pass band as disclosed, for example, in JP-A No. 131291/1995. With this arrangement, the first-stage filter and the second-stage filter differ in frequency at which spurious resonance occurs, whereby the ratio of the spurious resonance level to the signal level in the pass band is decreased, consequently affording a surface acoustic wave filter which is improved in characteristics outside the pass band.

Different characteristics are made available outside the pass band generally by making the component filters different in the pitch of reflectors or the number of pairs thereof as stated above, or in the number of electrode digits of the interdigital electrode. However, with filters of ever decreasing sizes developed in recent years, the space available for providing electrodes becomes limited, making it no longer possible to use such a method. It is therefore desired to provide a novel method of improving the characteristics outside the pass band.

Although the techniques disclosed in the above publication, JP-A No. 131291/1995, afford improved characteristics outside the pass band, the improvement is limited only to the spurious resonance occurring at the higher frequency side outside the pass band since the component filters are made different in the pitch of reflectors and/or the number of pairs thereof and thus made to differ in characteristics outside the pass band.

SUMMARY OF THE INVENTION

In view of the foregoing problems, the present invention provides a surface acoustic wave filter of the transversely coupled mode resonator type comprising an interdigital electrode 1 having a plurality of electrode digits, and two reflectors 2, 3 arranged respectively at opposite sides of the interdigital electrode 1 at a distance C from the electrode and each having a plurality of electrode digits as shown in FIG. 1. Suppose the digit pitch of the interdigital electrode is A, the digit pitch of each of the reflectors is B, and $C/\lambda$ is a dimensionless distance obtained by dividing the distance C by the wavelength $\lambda$ of surface acoustic waves. The filter is characterized in that the pitch ratio A/B and the distance C are determined on condition that on a two-dimensional coordinate system (X, Y) wherein the pitch ratio A/B is plotted as the Y-axis and the distance $C/\lambda$ is plotted as the X-axis, the pitch ratio A/B and the distance $C/\lambda$ be contained in a quadrilateral region having vertices at four points, i.e., point a (0.55, 0.983), point b (0.70, 1.010), point c (0.85, 1.010) and point d (0.85, 1.007) as shown in FIG. 9.

The invention further provides a surface acoustic wave filter comprising two filters of the transversely coupled mode resonator type connected in cascade and each having the same feature as above. The surface acoustic wave filter is characterized in that the pitch ratio A/B and the distance C are determined on condition that on a two-dimensional coordinate system (X, Y) wherein the pitch ratio A/B is plotted as the Y-axis and the distance $C/\lambda$ is plotted as the X-axis, the pitch ratio A/B and the distance $C/\lambda$ be contained in a quadrilateral region having vertices at four points, i.e., point a (0.55, 0.983), point b (0.70, 1.010), point c (0.85, 1.010) and point d (0.85, 1.007) as shown in FIG. 9.

The surface acoustic wave filter is further characterized in that one of the filters cascaded in two stages has a frequency at which higher transverse mode spurious resonance occurs outside the pass band, and the other cascaded filter has frequencies at which different degrees of higher transverse mode spurious resonance occur respectively outside the pass band, the resonance frequency of the above-mentioned one filter being intermediate between the resonance frequencies of the other filter.

BRIEF DESCRIPTION OF THE DRAWINGS

FIG. 2 is a list showing the results obtained by simulating the filter of the invention by a computer to determine the insertion loss and spurious resonance level;

FIG. 3 is a list showing the measurements obtained for samples of surface acoustic wave filters of the invention;

DETAILED DESCRIPTION OF EMBODIMENTS

Figure 1:
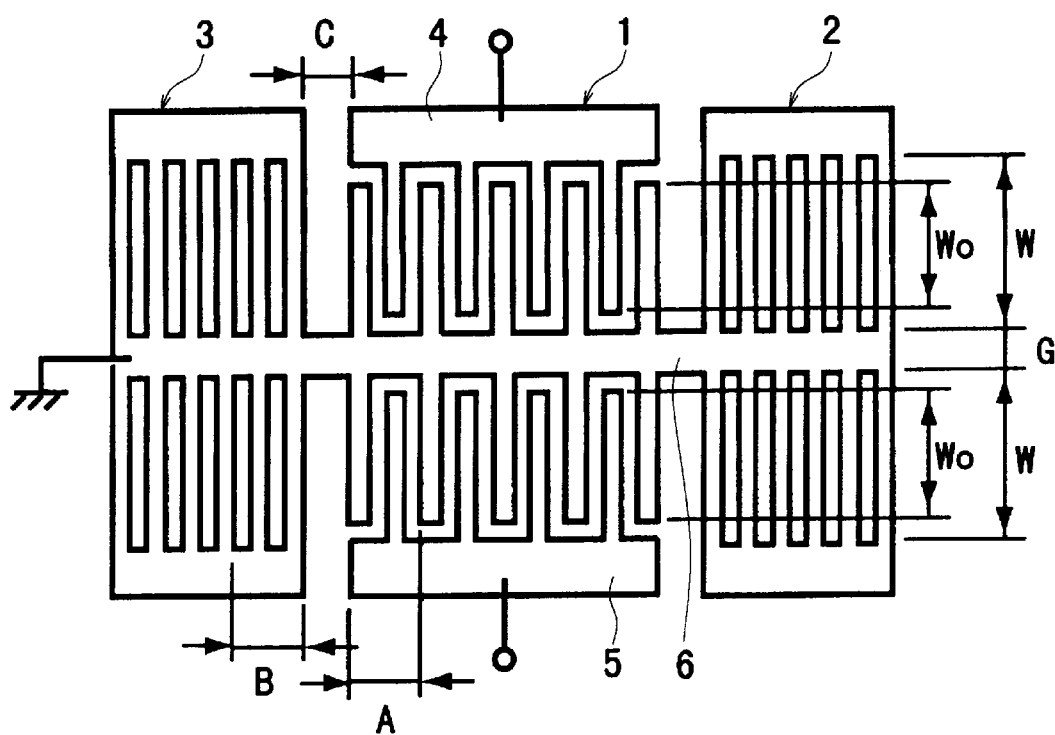
FIG. 1 is a plan view showing the shapes of electrodes included in a surface acoustic wave filter embodying the invention.
Figure 4A:
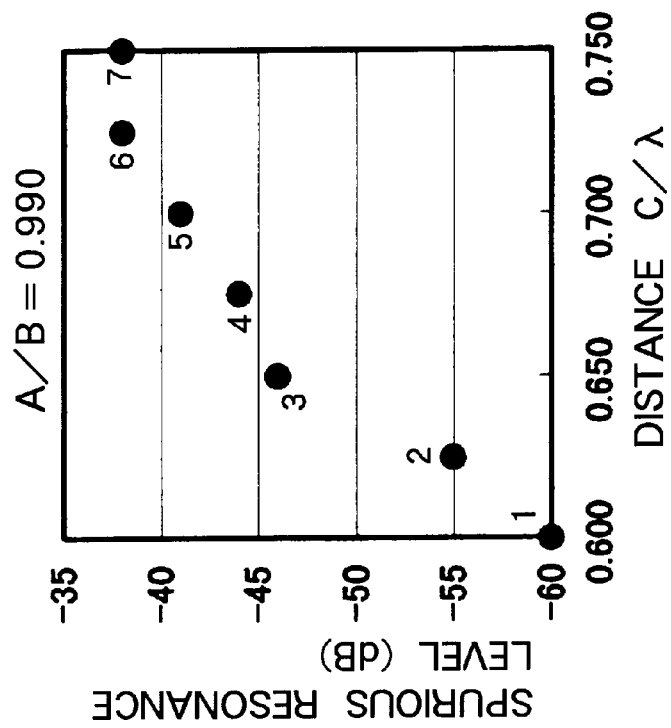
FIGS. 4A and 4B include graphs showing the results obtained with some of the samples.
Figure 4B:
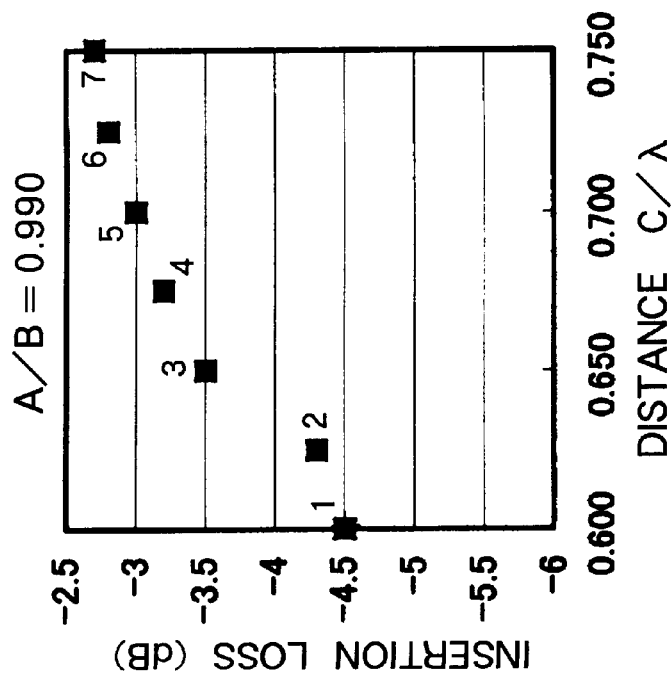

FIG. 1 shows a surface acoustic wave filter of the transversely coupled mode resonator type embodying the present invention. The filter comprises a comb-shaped interdigital electrode 1 having a plurality of electrode digits, and reflectors 2, 3 arranged respectively at opposite sides of the electrode and each having a plurality of electrode digits like a grating. An input electrode 4 and an output electrode 5 are connected to the interdigital electrode 1, and a common electrode 6 connected to the reflectors 2, 3 is grounded. The interdigital electrode 1 and the reflectors 2, 3 are each shaped symmetrically about the longitudinal axis of the common electrode 6.

With reference to FIG. 1, the pitch of the electrode digits forming the interdigital electrode 1 will be represented by A, the pitch of the electrode digits forming the reflectors 2, 3 by B, and the distance between the interdigital electrode 1 and each of the reflectors 2, 3 by C in the following description. Further the interlocking width of the electrode digits of the interdigital electrode 1 will be represented by Wo, the aperture width of the electrode digits of the interdigital electrode 1, as well as of the reflectors 2, 3, by W, and the width of the common electrode 6 by G. Suppose the acoustic wave velocity is V, and the center frequency is f. The wavelength $\lambda$ of surface acoustic waves is then expressed by $\lambda = V/f$ and is equal to the digit pitch A of the interdigital electrode 1.

The surface acoustic wave filter described was simulated by a computer using varying values for the ratio A/B of the digit pitch A of the interdigital electrode 1 to the digit pitch B of the reflectors 2, 3 and for the dimensionless distance $C/\lambda$ obtained by dividing the distance C between the interdigital electrode 1 and each of the reflectors 2, 3 by the wavelength $\lambda$ to calculate the magnitudes of insertion loss and spurious resonance level. FIG. 2 shows the results.

The dimensions shown in FIG. 1 and other physical conditions are set at the following values for the computer simulation. W: 351.45 $\mu$m, Wo: 324.80 $\mu$m, G: 14.20 $\mu$m, duty of the interdigital electrode: 55%, number of electrode digits of the interdigital electrode: 235, duty of the reflector: 75%, number of electrode digits of the reflector: 100, wavelength $\lambda$ of surface acoustic waves: 35.494 $\mu$m, film thickness of each electrode: 1.0 $\mu$m.

The insertion loss and the spurious resonance level were evaluated according to the criteria of up to –5 dB in the attenuation of practical insertion loss and at least –50 dB in the attenuation of practical spurious resonance level. In FIG. 2, the combinations of values fulfilling both the criteria are marked with a circle, and those failing to satisfy at least one of these criteria are marked with a cross.

The simulation results indicate that the surface acoustic wave filter fulfills the two criteria when the ratio A/B of the digit pitch A of the interdigital electrode to the digit pitch B of the reflectors is in the range of 0.9850 to 1.0100 and when the distance $C/\lambda$ between the interdigital electrode and each reflector is in the range of 0.575 to 0.850, consequently exhibiting satisfactory characteristics outside the pass band.

In order to substantiate the reasonability of the simulation results given in FIG. 2, samples of surface acoustic wave filters were prepared and tested for characteristics. The results are shown in FIG. 3, in which the samples having a spurious resonance level of –60 dB or lower are listed as being –60 dB in this level since the lower levels are difficult to measure. More specifically, samples 1 to 21 were fabricated which were 0.990, 0.995 or 1.000 in the ratio A/B of the digit pitch A of the interdigital electrode to the digit pitch B of the reflectors and in the range of 0.600 to 0.750 in the distances $C/\lambda$ between the interdigital electrode and each reflector which distance was increased with an increment of 0.025. The samples were the same as those used for the computer simulation in the dimensions shown in FIG. 1 and other physical conditions. Substrates of quartz were used which were 2.4 mm in length, 8 mm in width and 0.38 mm in thickness.

FIGS. 4A, 4B, 5A, 5B, 6A and 6B are graphs showing the measurements obtained for the samples and shown in FIG. 3. In these graphs, the samples with a spurious resonance level of –60 dB or lower are also shown as being –60 dB in this level. First, the insertion loss and spurious resonance level are plotted in FIGS. 4A and 4B for samples 1 to 7. Although samples 3 to 7 are up to –5 dB in the attenuation of the insertion loss, these samples are smaller than –50 dB in the attenuation of the spurious resonance level, hence an evaluation of cross mark. The other samples are marked with a circle for evaluation.

Figure 5A:
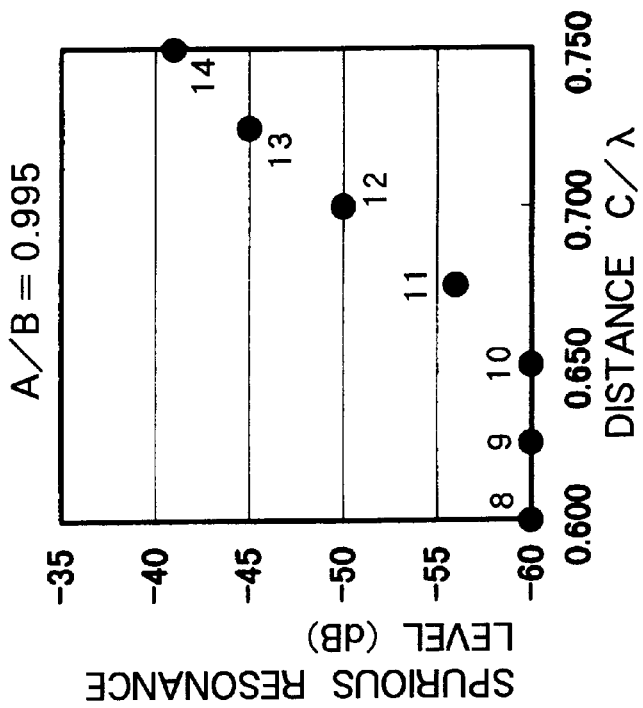
FIGS. 5A and 5B include graphs showing the results obtained with some of the samples.
Figure 5B:
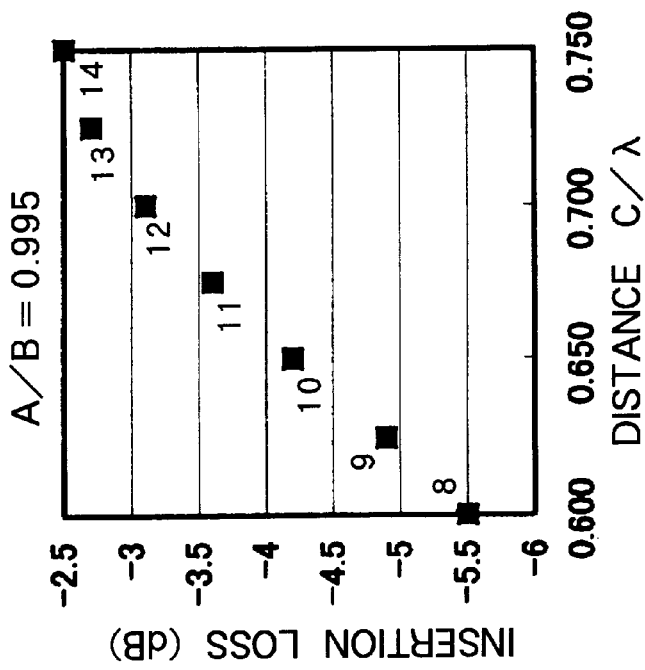

Next, plotted in FIGS. 5A and 5B are the insertion loss and spurious resonance level of samples 8 to 14. It is seen that sample 8 is above –5 dB in the attenuation of insertion loss, while samples 13 and 14 are below –50 dB in the attenuation of spurious resonance level. These samples are evaluated with a cross mark. The other samples are marked with a circle for evaluation.

Figure 6B:
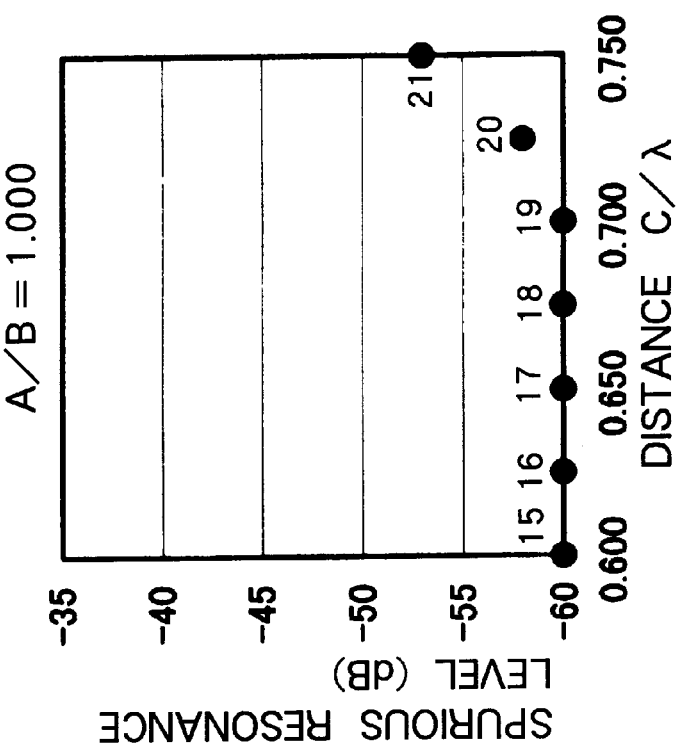
FIGS. 6A and 6B include graphs showing the results obtained with the other samples.
Figure 6A:
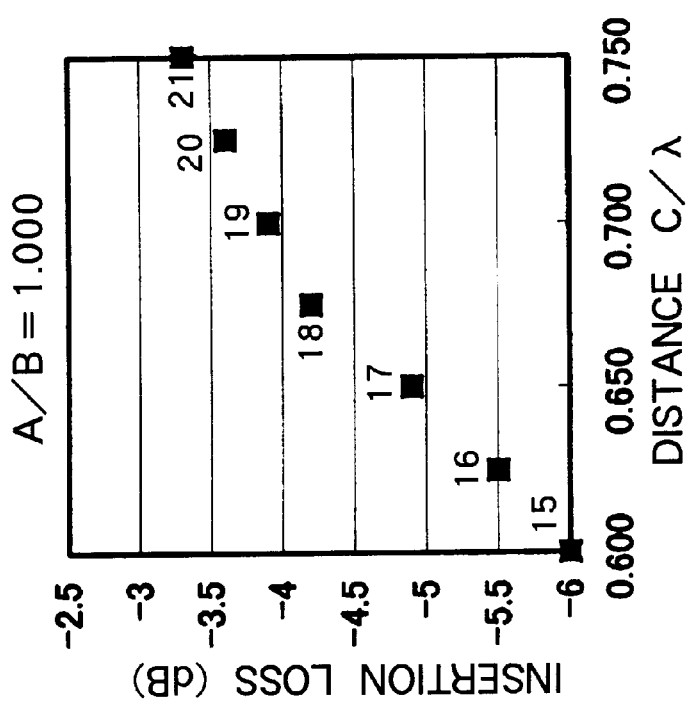

Further plotted in FIGS. 6A and 6B are the insertion loss and spurious resonance level of samples 15 to 21. It is seen that samples 15 and 16 are above –5 dB in the attenuation of insertion loss. These samples are evaluated with a cross mark, while the other samples are marked with a circle for evaluation.

When these results of evaluation were collated with the results of FIG. 2, the measurements obtained for the samples were found to be matched with the simulation results. The sample numbers are listed in combination with circle marks or cross marks in FIG. 2. Thus, the simulation results were found reasonable.

As a comparative example, a surface acoustic wave filter was fabricated by cascading two filters of the transversely coupled mode resonator type having the following dimensions or features. W: 651.45 $\mu$m, Wo: 324.80 $\mu$m, G: 14.20 $\mu$m, duty of the interdigital electrode: 55%, number of electrode digits of the interdigital electrode: 235, duty of the reflector: 75%, number of electrode digits of the reflector: 100, wavelength: 35.494 $\mu$m, film thickness: 1.0 $\mu$m, pitch ratio A/B: 0.990, distance $C/\lambda$: 0.75.

Figure 7:
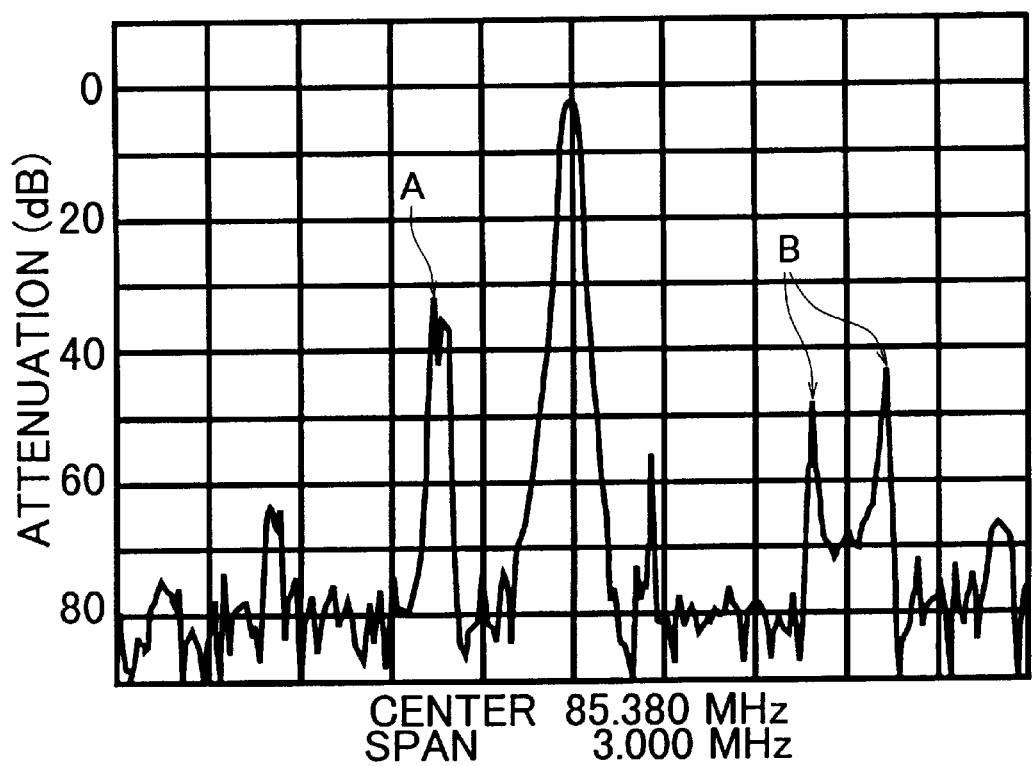
FIG. 7 is a graph showing the frequency characteristics of a comparative example.

The comparative example was checked for frequency characteristics with the results given in FIG. 7, which reveals resonance occurring outside the pass band, i.e., higher longitudinal mode spurious resonance indicated by an arrow A in the graph, and higher transverse mode spurious resonance indicated by arrows B in the graph.

Further as an embodiment of the invention, a surface acoustic wave filter was fabricated by cascading two filters of the transversely coupled mode resonator type having the following dimensions or features. W: 351.45 $\mu$m, Wo:

324.80 μm, G: 14.20 μm, duty of the interdigital electrode: 55%, number of electrode digits of the interdigital electrode: 235, duty of the reflector: 75%, number of electrode digits of the reflector: 100, wavelength: 35.494 μm, film thickness: 1.0 μm, pitch ratio A/B: 0.998, distance C/λ: 0.75.

Figure 8:
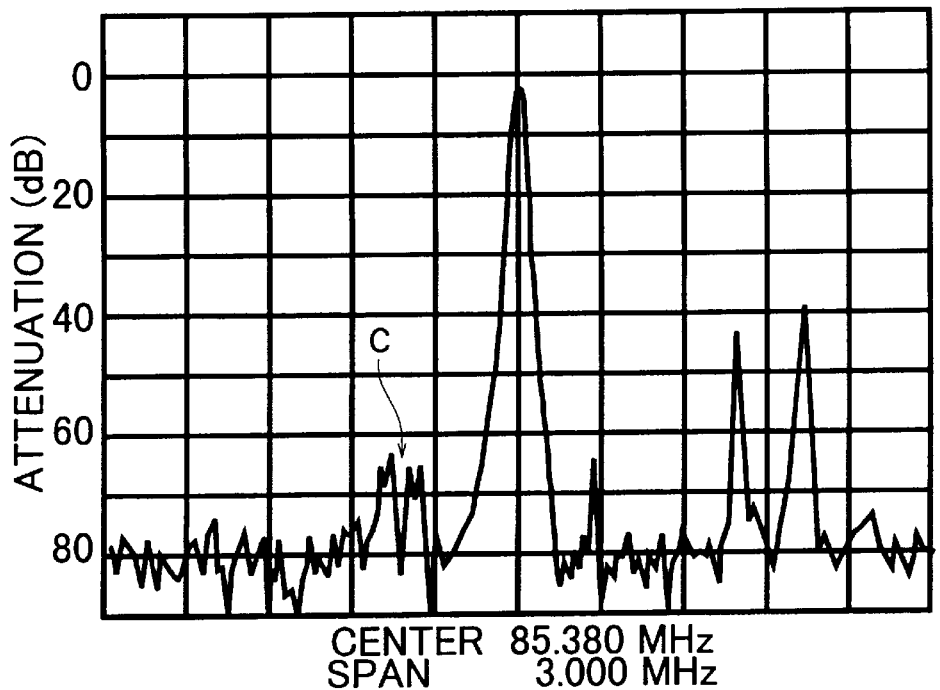
FIG. 8 is a graph showing the frequency characteristics of an embodiment of surface acoustic wave filter of the invention.

FIG. 8 shows the frequency characteristics of the embodiment. With the filter of the invention, higher longitudinal mode spurious resonance occurs at a diminished level at lower frequencies of the pass band as indicated by an arrow C in the graph, hence an improvement over the comparative example in characteristics at lower frequencies.

Figure 9:
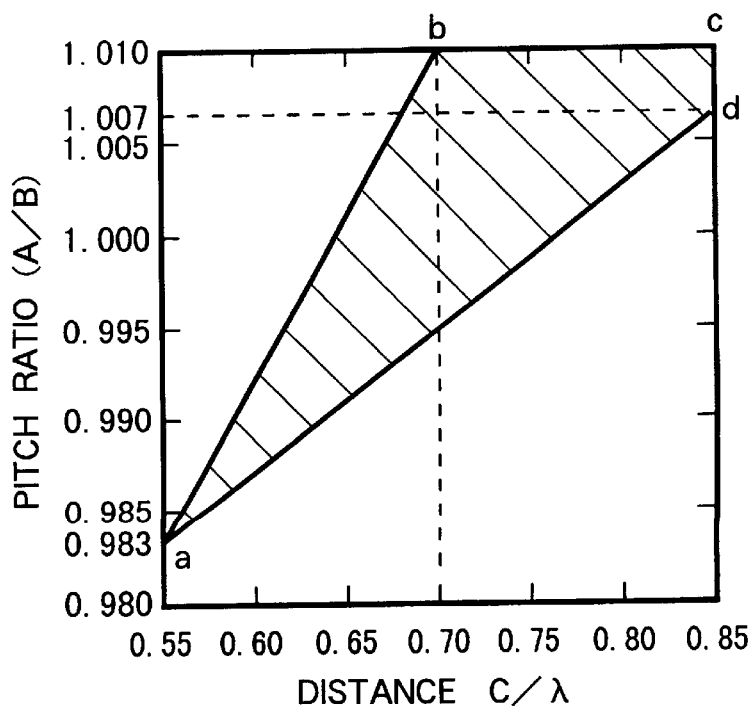
FIG. 9 is a graph showing a range in which the characteristics outside the pass band can be improved in connection with the ratio A/B wherein A is the digit pitch of an interdigital electrode, and B is the digit pitch of reflectors and with a distance $C/\lambda$ between the interdigital electrode and each reflector.

The simulation results and the actual sample measurements described above are shown as summarized in the form of a graph in FIG. 9. FIG. 9 shows by hatching the region of improved characteristics outside the pass band on a two-dimensional coordinate system (X, Y) wherein the ratio A/B of the digit pitch A of the interdigital electrode to the digit pitch B of the reflectors is plotted as the Y-axis, and the distance C/λ between the interdigital electrode and each reflector as the X-axis. The graph leads to the conclusion that the filter can be improved in characteristics outside the pass band when so designed that the ratio A/B and the distance C/λ are contained in a quadrilateral region having vertices at four points, i.e., point a (0.55, 0.983), point b (0.70, 1.010), point c (0.85, 1.010) and point d (0.85, 1.007).

Although the simulation results and the results actually obtained with the samples do not involve a pitch ratio A/B of 0.983, the graph of FIG. 9 indicates that the limits within which the characteristics outside the pass band can be improved are expressed by straight lines according to these results. This leads to the conclusion that the minimum value of pitch ratio A/B effective for improved characteristics is 0.983 and that the minimum value of distance C/λ similarly effective is 0.55.

The X coordinate of the point b (0.70, 1.01), 0.70, is the calculated value of X coordinate when the pitch ratio A/B is a limit value of 1.010 as read from FIG. 2. The Y coordinate of the point d (0.85, 1.007), 1.007, is the calculated value of Y coordinate when the distance C/λ is a limit value of 0.85 as read from FIG. 2. The upper limit of the pitch ratio A/B is determined in connection with the insertion loss of the filter. The upper limit of the distance C is determined in connection with the conditions for fabricating the filter and the insertion loss thereof. The spurious resonance occurs periodically with 0.5 N (N=1, 2, 3, . . . ) in connection with the distance C/λ, whereas if N is 2 or greater, the distance C/λ increases to result in a greater insertion loss to render the filter unfit for actual use although contributing to an improvement in spurious characteristics.

Figure 10:
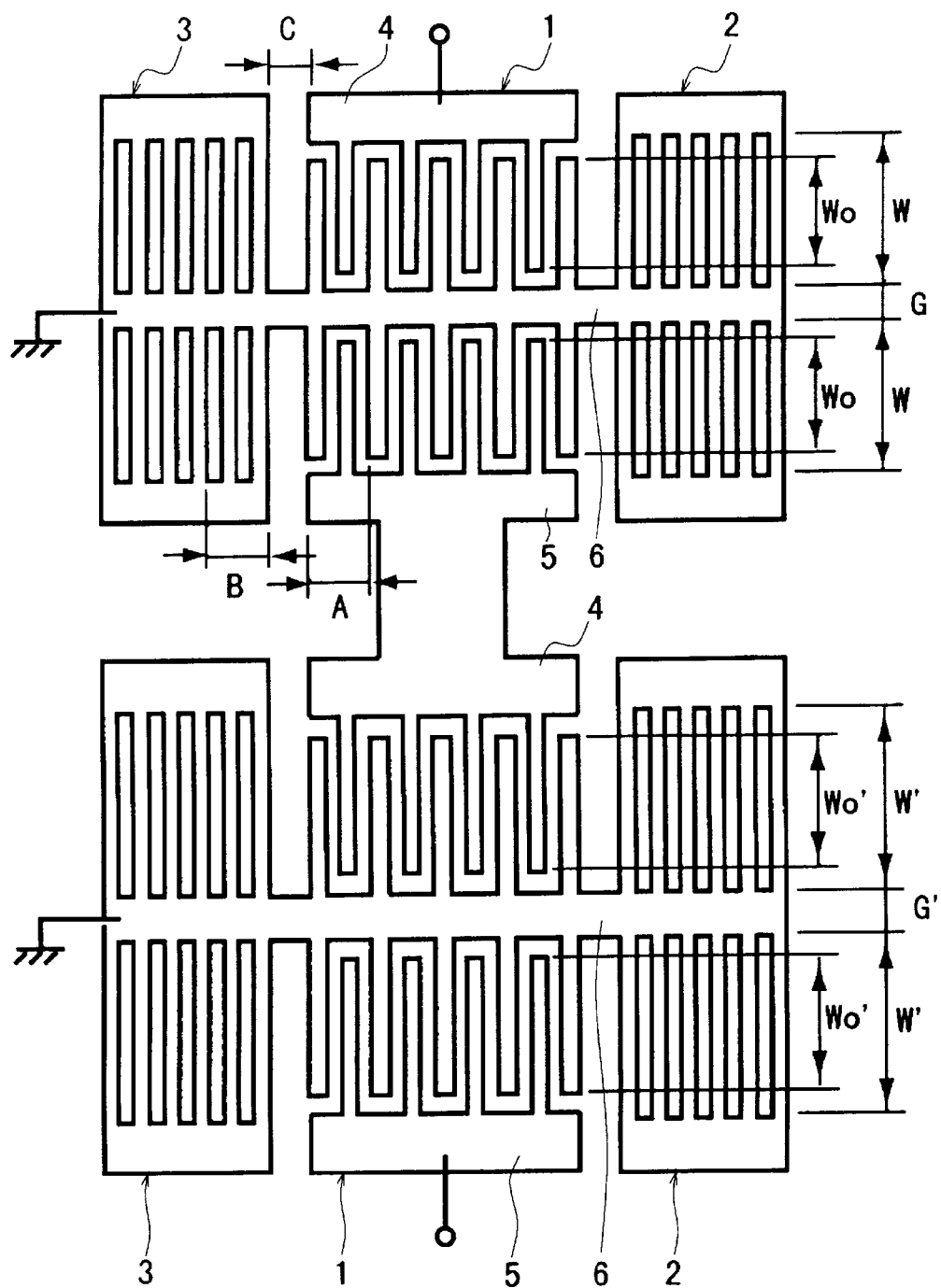
FIG. 10 is a plan view showing the shapes of electrodes included in another surface acoustic wave filter embodying the invention.

FIG. 10 shows another surface acoustic wave filter embodying the invention. This filter is fabricated by cascading two filters of the transversely coupled mode resonator type which are identical in pass-band characteristics but different in characteristics outside the pass band. The pitch ratio A/B and distance C of each of the component filters are so determined as to be contained in the quadrilateral region shown in FIG. 9 and having vertices at four points, i.e., point a (0.55, 0.983), point b (0.70, 1.010), point c (0.85, 1.010) and point d (0.85, 1.007). However, the aperture width W of the filter in the first stage is made different from the aperture width W' of the filter in the second stage as will be described below. With the exception of this feature, the two stages fulfill common conditions with respect to the digit pitches A and B and the distance C. When thus made different from each other in aperture width, the two cascaded filters are different in frequency at which higher transverse mode spurious resonance occurs, consequently exhibiting different characteristics outside the pass band.

Constructions adapted to suppress higher transverse mode spurious resonance will be discussed further with reference to the embodiment of FIG. 10. To suppress higher transverse mode spurious resonance, the aperture width is determined by the method to be described below.

Figure 11:
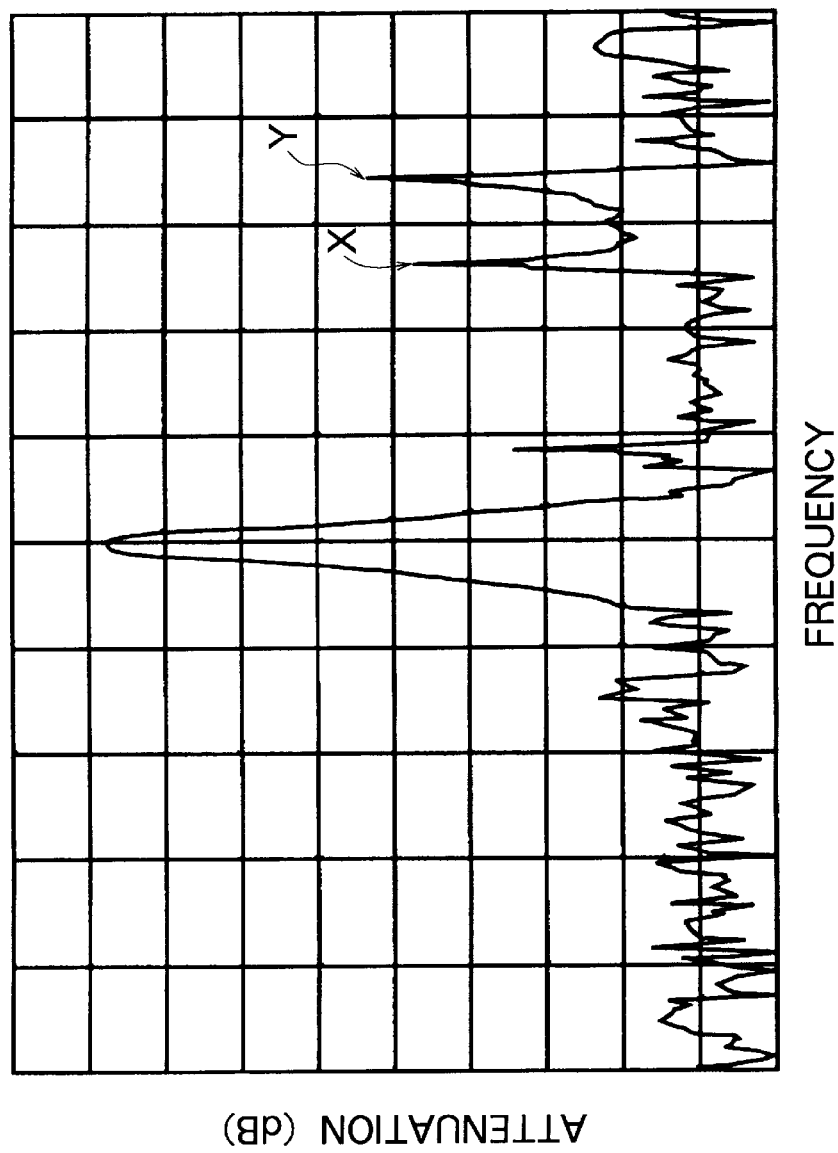
FIG. 11 is a graph showing higher transverse mode spurious resonance occurring in surface acoustic wave filters.

FIG. 11 shows frequency characteristics of common surface acoustic wave filters of the transversely coupled mode resonator type. It is seen that higher transverse mode spurious resonance occurs at two different positions of frequencies at the higher frequency side of the usual band. Stated more specifically, indicated at X in the graph is 3rd-order transverse mode spurious resonance, and at Y is 4th-order transverse mode spurious resonance. These resonance frequencies are dependent on the aperture widths of the interdigital electrode and the reflector.

Figure 12:
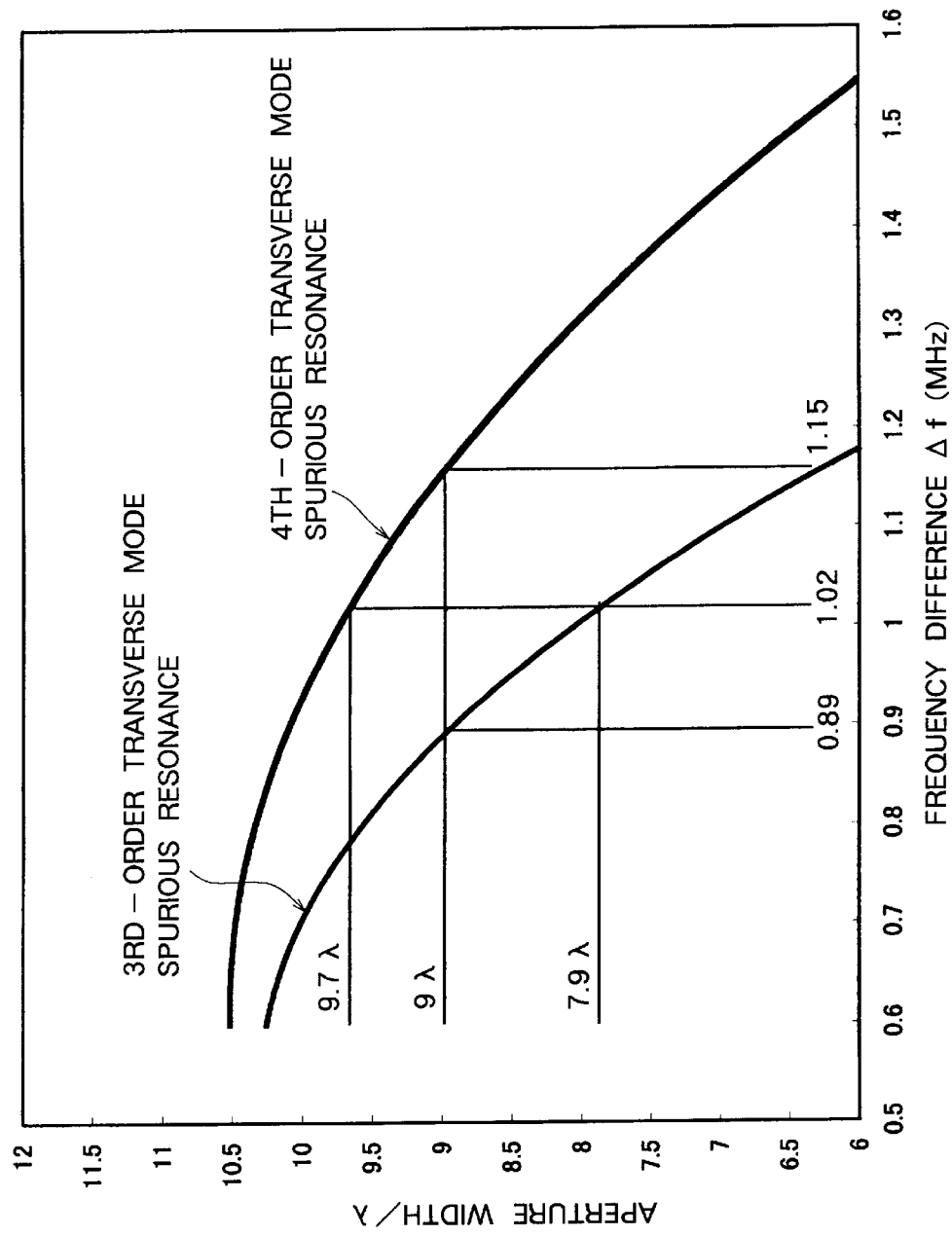
FIG. 12 is a graph showing the relationship between the aperture width and frequency differences between the center frequency and spurious resonance frequencies.

FIG. 12 shows the relationship between the dimensionless value obtained by dividing the aperture width by the wavelength λ and the frequency difference Δ f between the center frequency of the pass band and each of the spurious resonance frequencies. Assuming that the aperture width W of the filter in the first stage is 9.0 λ, the frequency difference Δ fx between the pass band center frequency and the 3rd-order transverse mode spurious resonance frequency is 0.89 MHz, the frequency difference Δ fy between the center frequency and the 4th-order transverse mode spurious resonance frequency is 1.15 MHz, and the frequency difference between the middle of the resonance frequencies and the center frequency is 1.02 MHz. Accordingly, if the aperture width W' of the filter in the second stage is so determined that the frequency difference between the center frequency and the 3rd-order transverse mode spurious resonance frequency of the second-stage filter or the frequency difference between the center frequency and the 4th-order transverse mode spurious resonance frequency thereof will be 1.02 MHz, the spurious resonance can be suppressed due to the presence of spurious resonance of one filter in the attenuation region of the other filter.

For example, the aperture width W' of the second-stage filter is set at 7.9 λ to give a frequency difference Δ fx of 1.02 MHz between the center frequency and the 3rd-order transverse mode spurious resonance frequency of the filter, or alternatively, the aperture width W' of the second-stage filter is set at 9.7 λ to give a frequency difference Δ fy of 1.02 MHz between the center frequency and the 4th-order transverse mode spurious resonance frequency thereof. The spurious resonance can th en be suppressed most effectively.

Figure 13:
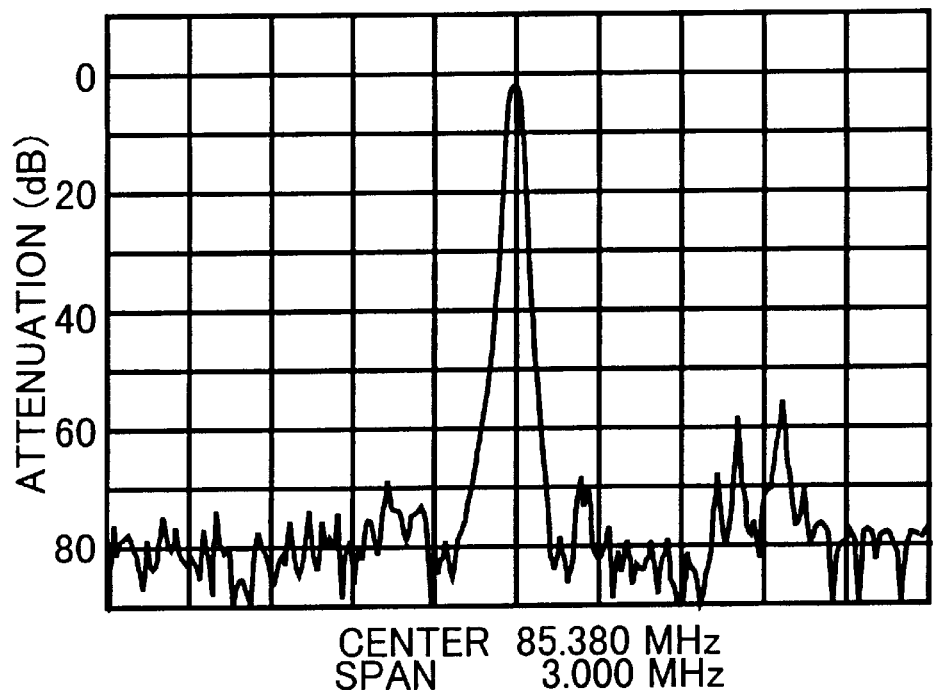
FIG. 13 is a graph showing the frequency characteristics of another surface acoustic wave filter embodying the invention.

FIG. 13 shows the frequency characteristics determined of a surface acoustic wave filter wherein an aperture width W' thus determined is given to a second-stage component filter there of. As compared with FIG. 8, FIG. 13 reveals that an improvement of about 15 dB is achieved in characteristics outside the pass band at the higher frequency side thereof. According to the present embodiment, the aperture width of the second-stage filter is determined by the method described based on the aperture width of the first-stage filter, whereas the aperture width of the first-stage filter may be determined based on that of the second-stage filter.

In the surface acoustic wave filter of the transversely coupled mode resonator type described above and embodying the invention, the pitch ratio A/B of the digit pitch A of the interdigital electrode to the digit pitch B of each reflector and the distance C/λ between the interdigital electrode and the reflector are determined on condition that on a two-dimensional coordinate system (X, Y) wherein the pitch ratio A/B is plotted as the Y-axis and the distance C/λ is plotted as the X-axis, the pitch ratio A/B and the distance C/λ be contained in a quadrilateral region having vertices at four points, i.e., point a (0.55, 0.983), point b (0.70, 1.010), point c (0.85, 1.010) and point d (0.85, 1.007) as shown in FIG. 9. The filter can therefore be given improved characteristics at the lower frequency side without using an increased number of electrodes to obtain the desired frequency characteristics, the invention thus serving to give a compacted device.

Further in the surface acoustic wave filter comprising two filters of the transversely coupled mode resonator type connected in cascade and each having the same construction as described above, the pitch ratio A/B of the digit pitch A of the interdigital electrode to the digit pitch B of each reflector and the distance C/λ between the interdigital electrode and the reflector are determined on condition that on a two-dimensional coordinate system (X, Y) wherein the pitch ratio A/B is plotted as the Y-axis and the distance C/λ is plotted as the X-axis, the pitch ratio A/B and the distance C/λ be contained in a quadrilateral region having vertices at four points, i.e., point a (0.55, 0.983), point b (0.70, 1.010), point c (0.85, 1.010) and point d (0.85, 1.007) as shown in FIG. 9. The filters cascaded in two stages are made different from each other in characteristics outside the pass band. These features serve to make the device compact while suppressing spurious resonance outside the pass band at the lower frequency side and the higher frequency side thereof.

One of the filters cascaded in two stages has a frequency at which higher transverse mode spurious resonance occurs outside the pass band, and the other cascaded filter has frequencies at which different degrees of higher transverse mode spurious resonance occur respectively outside the pass band, the resonance frequency of the above-mentioned one filter being intermediate between the resonance frequencies of the other filter, whereby spurious resonance can be suppressed reliably.

The filters cascaded in two stages are made different from each other in the aperture width of the electrode digits thereof, whereby the filters can be made different in characteristics outside the pass band without modifying other components thereof. This feature is useful for compact filters wherein the space for providing electrodes is limited.

The device of the invention is not limited only to the foregoing embodiments in construction but can be modified variously by one skilled in the art without departing from the spirit of the invention as set forth in the appended claims.

What is claimed is:

1. A surface acoustic wave filter comprising two filters of the transversely coupled mode resonator type connected in cascade and each comprising an interdigital electrode having a plurality of electrode digits, and two reflectors arranged respectively at opposite sides of the interdigital electrode at a distance C from the electrode and each having a plurality of electrode digits, each of the cascaded filters having a pitch ratio of A/B wherein A is the digit pitch of the interdigital electrode, and B is the digit pitch of each of the reflectors, the pitch ratio A/B and the distance C being determined on condition that on a two-dimensional coordinate system (X, Y) wherein the pitch ratio A/B is plotted as the Y-axis and a value C/λ obtained by dividing the distance C by the wavelength λ of surface acoustic waves is plotted as the X-axis, the pitch ratio A/B and the distance C/λ be contained in a quadrilateral region having vertices at four points, i.e., point a (0.55, 0.983), point b (0.70, 1.010), point c (0.85, 1.010) and point d (0.85, 1.007), wherein the filters of the transversely coupled mode resonator type cascaded in two stages are different from each other in characteristics outside the pass band, and wherein the filters of the transversely coupled mode resonator type cascaded in two stages are different from each other in the aperture width of the electrode digits thereof.

2. A surface acoustic wave filter comprising two filters of the transversely coupled mode resonator type connected in cascade and each comprising an interdigital electrode having a plurality of electrode digits, and two reflectors arranged respectively at opposite sides of the interdigital electrode at a distance C from the electrode and each having a plurality of electrode digits, each of the cascaded filters having a pitch ratio of A/B wherein A is the digit pitch of the interdigital electrode, and B is the digit pitch of each of the reflectors, the pitch ratio A/B and the distance C being determined on condition that on a two-dimensional coordinate system (X, Y) wherein the pitch ratio A/B is plotted as the Y-axis and the value C/λ obtained by dividing the distance C by the wavelength λ of surface acoustic waves is plotted as the X-axis, the pitch ratio A/B and the distance C/λ be contained in a quadrilateral region having vertices at four points, i.e., point a (0.55, 0.983), point b (0.70, 1.010), point c (0.85, 1.010) and point d (0.85, 1.007), wherein one of the filters of the transversely coupled mode resonator type cascaded in two stages has a frequency at which higher transverse mode spurious resonance occurs outside the pass band, and the other cascaded filter of the transversely coupled mode resonator type has frequencies at which different degrees of higher transverse mode spurious resonance occur respectively outside the pass band, the resonance frequency of said one filter being intermediate between the resonance frequencies of the said other filter.

3. A surface acoustic filter according to claim 2, wherein the different degrees of higher transverse mode spurious resonance occurring outside the pass band are 3rd-order transverse mode spurious resonance and 4th-order transverse mode spurious resonance.

* * * * *